(12) United States Patent
Lexmond et al.

(10) Patent No.: US 8,982,316 B2
(45) Date of Patent: Mar. 17, 2015

(54) LITHOGRAPHIC APPARATUS, A METROLOGY APPARATUS AND A METHOD OF USING THE APPARATUS

(75) Inventors: Axel Sebastiaan Lexmond, Voorschoten (NL); Sjoerd Nicolaas Lambertus Donders, Vught (NL); Johannes Henricus Wilhelmus Jacobs, Eindhoven (NL); Leonard Ferdinand Gerard Geers, Valkenburg (NL)

(73) Assignee: ASML Netherlands B.V., Veldhoven (NL)

( * ) Notice: Subject to any disclaimer, the term of this patent is extended or adjusted under 35 U.S.C. 154(b) by 1211 days.

(21) Appl. No.: 12/483,627

(22) Filed: Jun. 12, 2009

(65) Prior Publication Data

US 2010/0014060 A1   Jan. 21, 2010

Related U.S. Application Data

(60) Provisional application No. 61/129,282, filed on Jun. 16, 2008, provisional application No. 61/136,882, filed on Oct. 10, 2008.

(51) Int. Cl.
*G03F 7/20* (2006.01)

(52) U.S. Cl.
CPC ........ *G03F 7/70891* (2013.01); *G03F 7/70341* (2013.01); *G03F 7/7085* (2013.01)
USPC ................... 355/30; 355/52; 355/53; 355/55; 355/67; 355/72; 355/77

(58) Field of Classification Search
USPC .......... 355/30, 52, 53, 55, 67, 72, 77; 356/43; 374/121, 126, 127, 161, E11.016; 250/483.1–484.4
See application file for complete search history.

(56) References Cited

U.S. PATENT DOCUMENTS 4,075,493 A * 2/1978 Wickersheim ................ 374/159
4,455,741 A * 6/1984 Kolodner ........................ 438/16
(Continued)

FOREIGN PATENT DOCUMENTS

EP   1420299 A2   5/2004
EP   1420300 A2   5/2004
(Continued)

OTHER PUBLICATIONS

Japanese Office Action mailed Jul. 26, 2011 in corresponding Japanese Patent Application No. 2009-137821.

*Primary Examiner* — Christina Riddle
(74) *Attorney, Agent, or Firm* — Pillsbury Winthrop Shaw Pittman LLP

(57) ABSTRACT

A lithographic projection apparatus is disclosed that comprises a substrate table, a projection system, a liquid confinement structure and a thermal measurement system. The substrate table is configured to support a substrate. The projection system is configured to direct a patterned beam of radiation on to a target portion of the substrate. The liquid confinement structure is configured to at least partly confine an immersion liquid to a space between the projection system and the substrate, the substrate table, or both. The thermal measurement system comprises a thermally sensitive coating. The thermal measurement system is configured to detect the temperature of the immersion liquid in contact with the coating. Also disclosed is a thermal measurement system, a metrology system comprising the thermal measurement system and a dummy wafer for the thermal measurement system.

20 Claims, 10 Drawing Sheets

(56) References Cited

U.S. PATENT DOCUMENTS

| | | | |
|---|---|---|---|
| 4,509,852 A | | 4/1985 | Tabarelli et al. |
| 4,668,077 A | * | 5/1987 | Tanaka ............................ 355/30 |
| 5,431,742 A | * | 7/1995 | Kleinerman .................. 136/247 |
| 5,763,775 A | * | 6/1998 | Sato et al. .................. 73/204.26 |
| 6,207,077 B1 | * | 3/2001 | Burnell-Jones .......... 252/301.36 |
| 6,575,620 B1 | * | 6/2003 | Banaszak et al. ................. 374/4 |
| 6,704,089 B2 | * | 3/2004 | van der Schaar et al. ....... 355/53 |
| 6,770,220 B1 | * | 8/2004 | Klimant ................... 252/301.36 |
| 7,310,132 B2 | | 12/2007 | Van Der Schoot et al. |
| 7,483,117 B2 | | 1/2009 | Hirukawa |
| 2001/0019103 A1 | * | 9/2001 | Sugai et al. .............. 250/227.18 |
| 2001/0022804 A1 | * | 9/2001 | Helmig et al. ................. 374/161 |
| 2003/0112443 A1 | * | 6/2003 | Hjelme et al. ................. 356/480 |
| 2004/0136494 A1 | | 7/2004 | Lof et al. |
| 2004/0207824 A1 | | 10/2004 | Lof et al. |
| 2006/0033898 A1 | * | 2/2006 | Cadee et al. .................... 355/53 |
| 2006/0038968 A1 | | 2/2006 | Kemper et al. |
| 2006/0082744 A1 | * | 4/2006 | Hirukawa ....................... 355/30 |
| 2006/0119809 A1 | | 6/2006 | Verhagen et al. |
| 2006/0158627 A1 | | 7/2006 | Kemper et al. |
| 2006/0209282 A1 | * | 9/2006 | Arai ................................ 355/53 |
| 2007/0132972 A1 | * | 6/2007 | Streefkerk et al. .............. 355/53 |
| 2010/0265477 A1 | * | 10/2010 | Endo et al. ..................... 355/30 |

FOREIGN PATENT DOCUMENTS

| | | |
|---|---|---|
| JP | 2001-004460 | 1/2001 |
| JP | 2004-251789 | 9/2004 |
| JP | 2005-012201 | 1/2005 |
| JP | 2006-303295 | 11/2006 |
| WO | 99/49504 A1 | 9/1999 |
| WO | 2005/064405 A2 | 7/2005 |

\* cited by examiner

FIG. 7: a schematic of the temperature-sensitive sphere topology and the temperature dependence of the emission specturm, system A FIG. 8 : a schematic of a PIV/PTV particle with a temperature-sensitive coating.
Particle and coating are not to scale FIG. 9: a schematic of the temperature-sensitive coating and the temperature dependence of the emission specturm, system B

LITHOGRAPHIC APPARATUS, A METROLOGY APPARATUS AND A METHOD OF USING THE APPARATUS

This application claims priority and benefit under 35 U.S.C. §119(e) to U.S. Provisional Patent Application Ser. No. 61/129,282, entitled "Lithographic Apparatus, A Metrology Apparatus and A Method Of Using The Apparatus", filed on Jun. 16, 2008, and to U.S. Provisional Patent Application Ser. No. 61/136,882, entitled "Lithographic Apparatus, A Metrology Apparatus and A Method Of Using The Apparatus", filed on Oct. 10, 2008. The contents of those applications are incorporated herein in their entirety by reference.

FIELD

The present invention relates to an immersion lithographic apparatus, a metrology apparatus, method using the apparatus, and a thermal measurement system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, another fluid may be suitable, particularly a wetting fluid, an incompressible fluid and/or a fluid with a higher refractive index than air, desirably a higher refractive index than water. Fluids excluding gases are particularly desirable. The point of this is to enable imaging of smaller features since the exposure radiation will have a shorter wavelength in the liquid. (The effect of the liquid may be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic, e.g. Decalin, or a fluorohydrocarbon, or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a fluid handling system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

An immersion lithography apparatus with a localized fluid handling system is shown in FIG. 4. Liquid is supplied by two groove inlets IN on either side of the projection system PS and is removed by a plurality of discrete outlets OUT arranged radially outwardly of the inlets IN. The inlets IN and OUT can be arranged in a plate with a hole in its centre and through which the projection beam is projected. Liquid is supplied by one groove inlet IN on one side of the projection system PS. Liquid is removed by a plurality of discrete outlets OUT on the other side of the projection system PS. This causes a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European patent application publication no. EP 1420300 and U.S. patent application publication No. 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in U.S. patent application publication No. US 2006/0119809. A member is provided which covers the substrate W in all positions and which is arranged to have immersion liquid extending between it and the top surface of the substrate and/or substrate table which holds the substrate.

SUMMARY

Temperature variations in fluid media in a lithographic apparatus, for example, the immersion liquid between a final optical element and a substrate are a source of imaging errors. Such errors include focus and overlay errors. Temperature stability of an apparatus, particularly an immersion apparatus can be dependent upon temperature of fluid flowing over a surface. Immersion liquid temperature measurement is therefore helpful to ensure high thermal stability and homogeneity. The requirements for such a measurement are about ~1 mK temperature variations over time with high spatial resolution. Critical temperature fluid measurements may be required from inaccessible or difficult to access locations. The measurements may be required to detect in real-time, for example, ~1 mK variations at millisecond timescales. Current available measurement methods are not able to meet one or more of these or other requirements. Systems and devices are known which achieve such high resolution, but such systems for example are either disposable or feature connected sensors.

Disposable sensors systems, include disposable devices such as the dummy substrate produced by SensArray Corporation, uses components which tend to be short lived and so have a short life. In a system such as the SensArray dummy substrate the temperature measurement data is stored on a memory on the substrate. The data is downloaded after the dummy substrate is removed from the system and analyzed later, off-line. Thus, such a system cannot provide 'real-time' information.

In a system which uses a connected sensor, the sensor in contact with the fluid, e.g. immersion liquid, is in physical contact, e.g. by electrical wiring, to the rest of the measurement system external to the measurement location. It may be difficult to fit such a connected sensor in a location which is difficult to access.

It is desirable to have the capability of determining spatially resolved temperature profiles as a function of time in fluid in an immersion apparatus. This information can be used to minimize variations in temperature, compensate for variations in temperature, predict variations in temperature and/or design the apparatus to reduce fluctuations in temperature of the fluid. Such a system would be useful particularly off-line.

It is desirable to provide a non-intrusive temperature measurement system and method to measure the temperature of fluid media and/or an object in a lithographic apparatus. A fluid media may be a fluid such as immersion liquid. The system desirably is capable of detecting ~1 mK temperature variations over time with high spatial resolution. It is desirable that the temperature measurement system may be implemented in-line to take temperature measurements of fluid and/or a surface of an object in, for example, an immersion system before and during operation of a lithographic apparatus to provide real-time information. Such a measurement system connected to a control system may enable greater thermal stability and homogeneity during operation, minimizing or reducing focus and overlay errors.

In an embodiment of the present invention, there is provided a lithographic apparatus comprising a thermal measurement system comprising a thermally sensitive coating or a Bragg reflector, the thermal measurement system configured to detect a temperature of the coating or Bragg reflector.

In an embodiment of the present invention, there is provided a lithographic apparatus, comprising: two tables, one of which being a substrate table configured to support a substrate; a projection system configured to direct a patterned beam of radiation on to a target portion of the substrate; a liquid handling structure configure to supply and at least partly confine an immersion liquid to a space between the projection system and the substrate, a table, or the table and the substrate; and a thermal measurement system comprising a thermally sensitive coating or a Bragg reflector, the thermal measurement system configured to detect a temperature of the immersion liquid in contact with the coating or Bragg reflector.

In an embodiment of the present invention, there is provided a metrology apparatus, comprising: a table; a liquid handling structure configured to at least partly confine immersion liquid to a space above a portion of the table; and a thermal measurement system comprising an optically responsive, thermally sensitive coating or a Bragg reflector, the thermal measurement system configured to detect a temperature of the immersion liquid in contact with the coating or Bragg reflector.

In an embodiment of the present invention, there is provided a thermal measurement system for a metrology apparatus or a lithographic apparatus, the thermal measurement system comprising: an optical source configured to supply a beam of radiation; a coating or Bragg reflector applied to a surface to be thermally sensed, the coating emitting radiation in response to the beam of radiation from the optical source; and a detector configured to detect radiation emitted by the coating or Bragg reflector, wherein a property of the radiation emitted by the coating or Bragg reflector in response to the radiation beam is dependent on a temperature of the coating or Bragg reflector.

In an embodiment of the present invention, there is provided a dummy substrate for use in a thermal measurement system of an immersion lithographic apparatus, the dummy substrate having a coating or Bragg reflector, wherein the coating or Bragg reflector is configured to emit radiation in response to a radiation beam from an optical source, the emitted radiation having a property which is dependent on a temperature of the coating or Bragg reflector.

In an embodiment of the present invention, there is provided a method of thermal measurement in a lithographic apparatus, the method comprising detecting radiation emitted by a thermally sensitive coating or a Bragg reflector.

In an embodiment of the present invention, there is provided a method of thermal measurement in a metrology apparatus wherein immersion liquid is confined to a space above a portion of a table, the thermal measurement comprising detecting radiation emitted by a thermally sensitive coating or a Bragg reflector in contact with the immersion liquid.

In an embodiment of the present invention, there is provided a thermal measurement method in a metrology apparatus or a lithographic apparatus, comprising: supplying a beam of radiation to a coating or a Bragg reflector applied to a surface on which the thermal measurement is performed; detecting radiation emitted by the coating or Bragg reflector; and determining the thermal measurement from a property of the emitted radiation which is detected.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
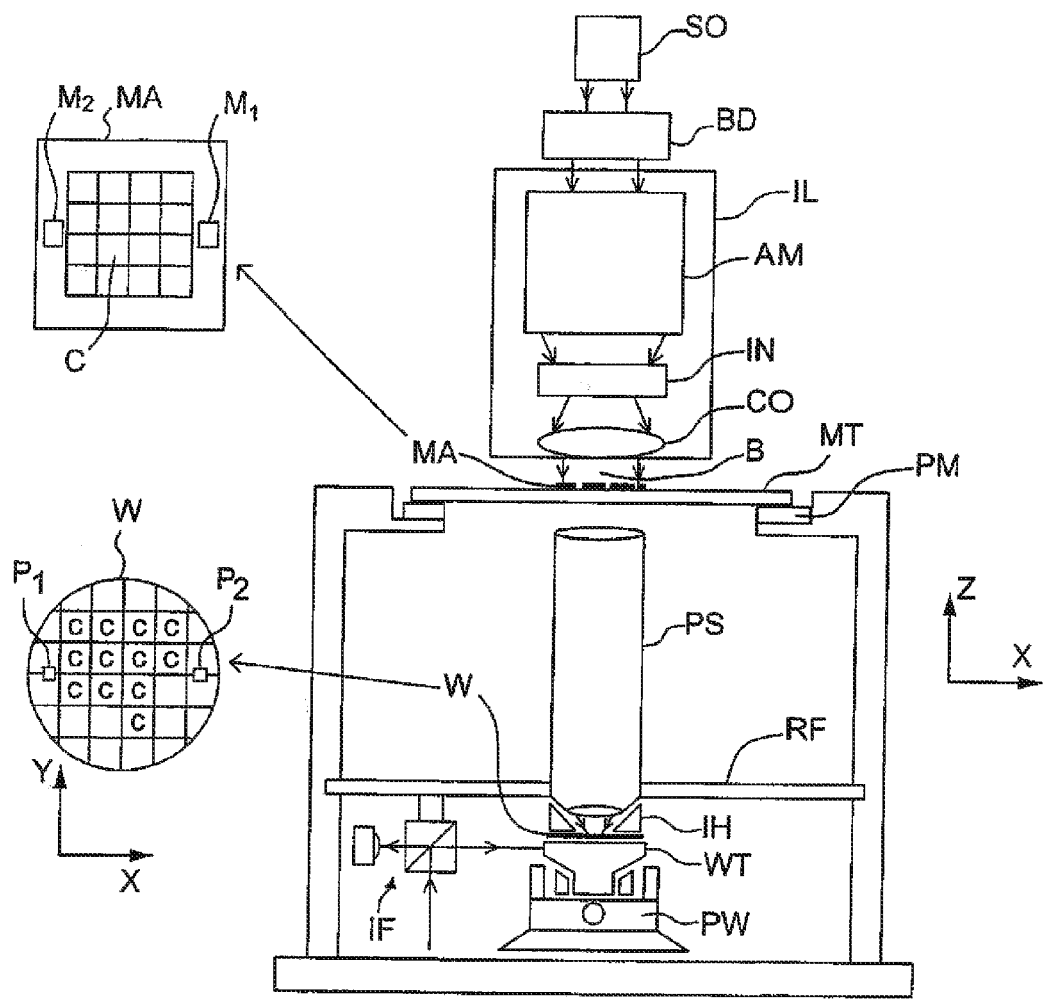
FIG. 1 depicts a lithographic apparatus according to an embodiment of the invention.
Figure 2:
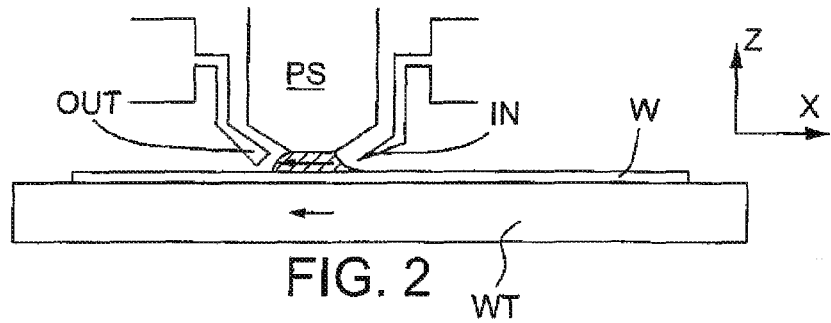
FIGS. 2 and 3 depict a liquid supply system for use in a lithographic projection apparatus.
Figure 3:
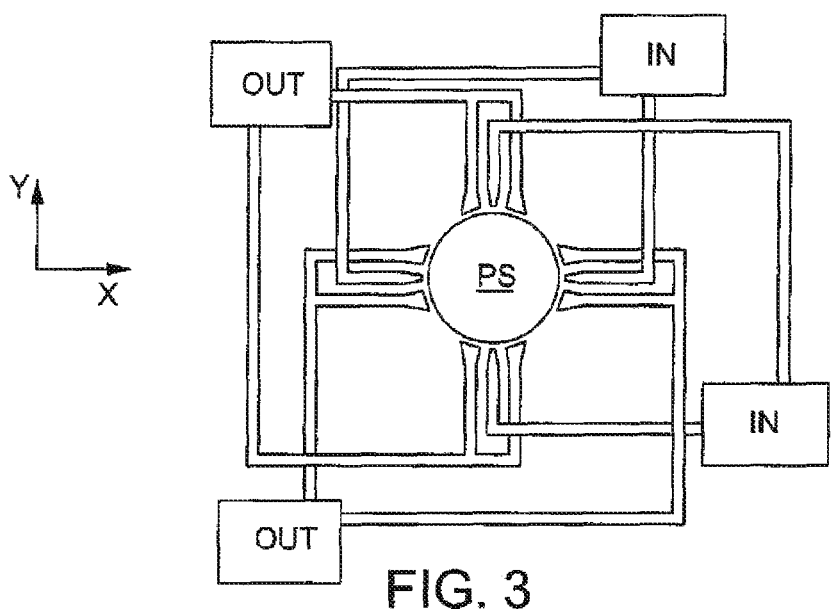
Figure 4:
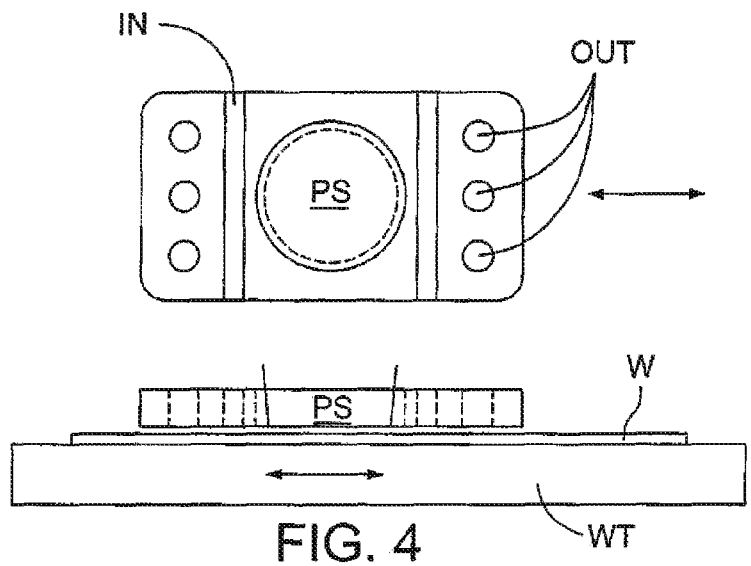
FIG. 4 depicts a further liquid supply system for use in a lithographic projection apparatus.

FIG. 1 schematically depicts a lithographic apparatus according to an embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement for providing liquid between a final element of the projection system PS and the substrate is the so called localized immersion system. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

Figure 5:
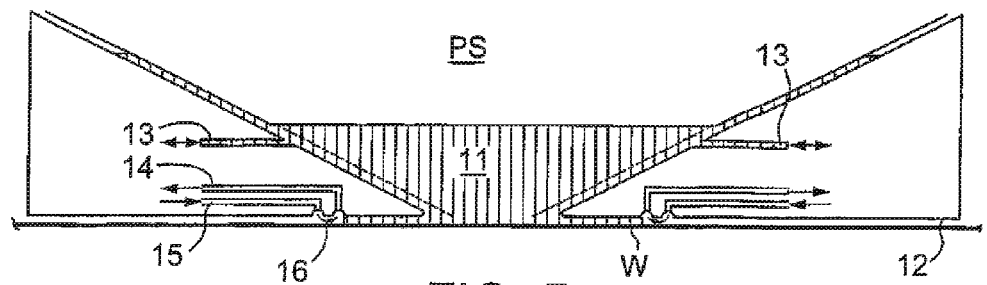
FIG. 5 depicts, in cross-section, a barrier member which may be used in an embodiment of the present invention as a liquid supply system.

Another immersion lithography apparatus with a localized fluid handling system solution which has been proposed provides the fluid handling system with a barrier member (or so-called immersion hood IH). FIG. 5 schematically depicts a localized liquid supply system with a barrier member 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a gas seal or fluid seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below and surrounding the final element of the projection system PL. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in U.S. Patent Application Publication No. 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. Relative movement of that part of the liquid supply system and the substrate W may lead to breakdown of the seal and thereby leaking of liquid. The problem is more significant at high scan velocities. An increased scan velocity is desirable because throughput increases.

Figure 6:
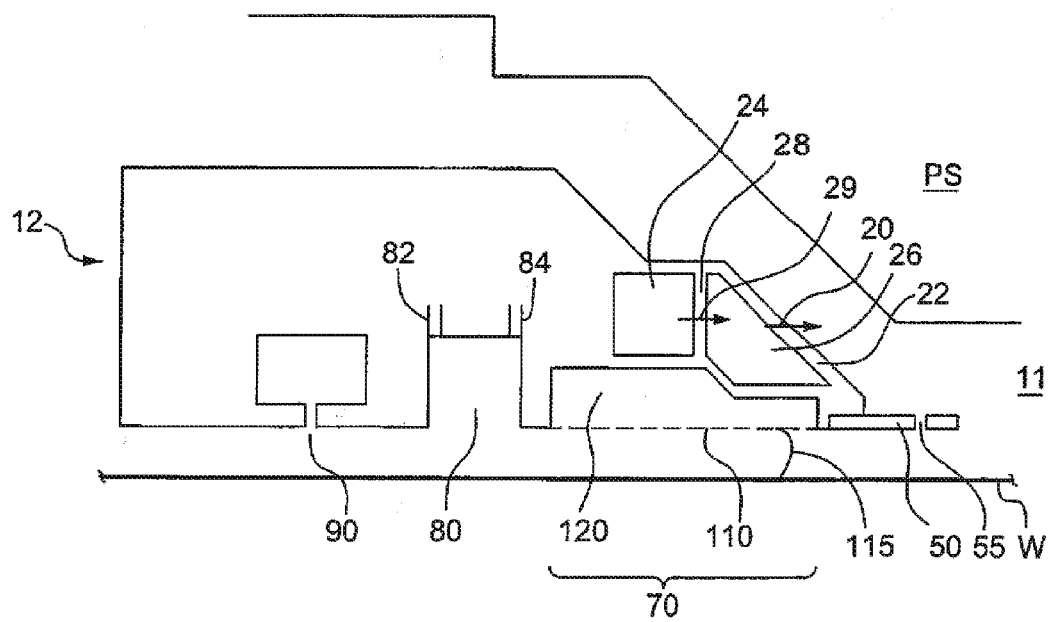
FIG. 6 illustrates, in cross-section, another barrier member which may be used in an embodiment of the present invention.

FIG. 6 illustrates a barrier member 12 which is part of a liquid supply system. The barrier member 12 extends around the periphery of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped. The barrier member could be other shapes so long as it has an opening through which the projection beam may pass out from the final element of the projection system PS. The opening may be centrally located. Thus during exposure the beam B may pass through liquid contained in the opening of the barrier member and onto the substrate W. The barrier member 12 may be, for example, substantially rectangular and is not necessarily the same shape as the final element of the projection system PS is at the height of the barrier member 12.

The function of the barrier member 12 is to at least partly maintain or confine liquid in the space between the projection system PS and the substrate W so that the beam B may pass through the liquid. The top level of liquid is simply contained by the presence of the barrier member 12 and the level of liquid in the space is maintained such that the liquid does not overflow over the top of the barrier member 12.

The immersion liquid is provided to the space 11 by the barrier member 12. A passageway or flow path for immersion liquid passes through the barrier member 12. Part of the flow path is comprised by a chamber 26. The chamber 26 has two side walls 28, 22. A liquid flow 29 passes from a chamber 24 through the first side wall 28 into chamber 26 and then through the second side wall 22 into the space 11. A plurality of outlets 20 provide the liquid to the space 11.

A seal is provided between the bottom of the barrier member 12 and the substrate W. In FIG. 6 a seal device is configured to provide a contactless seal and is made up of several components. Radially outward from the optical axis of the projection system PS, there is provided a (optional) flow plate 50 which extends into the space (though not into the path of the beam B) which helps maintain substantially parallel flow of the immersion liquid out of outlet 20 across the space. The flow control plate 50 has through holes 55 in it to reduce the resistance to movement in the direction of the optical axis of the barrier member 12 relative to the projection system PS and/or substrate W.

Radially outwardly of the flow control plate 50 on the bottom surface of the barrier member 12 may be an inlet 180. The inlet 180 can provide liquid in a direction towards the substrate. During imaging this may be useful in preventing bubble formation in the immersion liquid by filling a gap between the substrate W and substrate table WT with liquid.

Radially outwardly of the inlet 180 may be an extractor assembly 70 to extract liquid from between the barrier member 12 and the substrate W and/or the substrate table WT. The extractor 70 will be described in more detail below and forms part of the contactless seal which is created between the barrier member 12 and the substrate W. The extractor may operate as a single phase or as a dual phase extractor.

Radially outwardly of the extractor assembly 70 may be a recess 80. The recess is connected through an inlet 82 to the atmosphere. The recess if connected via an outlet 84 to a low pressure source. Radially outwardly of the recess 80 may be a gas knife 90. An arrangement of the extractor, recess and gas knife is disclosed in detail in U.S. Patent Application Publication No. 2006/0158627.

The extractor assembly 70 comprises a liquid removal device or extractor or inlet such as the one disclosed in U.S. Patent Application Publication No. 2006-0038968. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 70. However, when the porous surface 110 comes into contact with liquid there is no meniscus to restrict flow and the liquid can flow freely into the chamber 120 of the liquid removal device 70. The porous surface 110 extends radially inwardly along the barrier member 12 (as well as around the space). The rate of extraction through the porous surface 110 varies according to how much of the porous material 110 is covered by liquid.

The porous material 110 has a large number of small holes, e.g. of diameter $d_{hole}$ in the range of 5 to 50 μm, and is maintained at a height in the range of 50 to 300 μm above a surface from which liquid is to be removed, e.g. the surface of a substrate W. In an embodiment, porous material 110 is at least slightly liquidphilic (e.g., hydrophilic), i.e. having a contact angle of less than 90° to the immersion liquid, e.g. water.

It may not always be possible to prevent gas being drawn into the liquid removal device but the porous material 110 will prevent large uneven flows that may cause vibration. Microsieves made by electroforming, photoetching and/or laser cutting can be used as the porous material 110. Suitable sieves are made by Stork Veco B.V., of Eerbeek, the Netherlands. Other porous plates or solid blocks of porous material may be used, provided the pore size is suitable to maintain a meniscus with the pressure differential that will be experienced in use.

During scanning of the substrate W (during which the substrate moves under the barrier member 12 and projection system PS) the meniscus 115 extending between the substrate W and the barrier member 12 can be drawn either towards or away from the optical axis by a drag force applied by the moving substrate. This can lead to liquid loss which may result in: evaporation of the liquid, cooling of the substrate, and consequent shrinkage and overlay errors as described above. Liquid stains may also or alternatively be left behind from interaction between the liquid droplets and resist photochemistry Although not specifically illustrated in FIG. 6, the liquid supply system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery of the barrier member 12 during movement of the barrier member 12 relative to the projection system PS. In an alternative or additional arrangement, liquid may be removed from the top of the barrier member 12 using, for example, an extractor such as a single phase extractor similar to the extractor 70. An alternative or additional feature is a liquidphobic (e.g., hydrophobic) coating. The coating may form a band around the top of the barrier member 12 surrounding the opening and/or around the last optical element. The coating may be radially outward of the optical axis of the projection system. The liquidphobic coating keeps the immersion liquid in the space.

In an apparatus in which two substrate tables or stages are provided in which each one carries a substrate, there exists a difficulty during swap of one substrate from underneath the projection system to another substrate table underneath the projection system. This is because if the liquid from the liquid supply system is removed prior to swapping the tables then drying stains can appear on the final element of the projection system. One solution to this problem which has been proposed is to provide a dummy substrate which is positionable under the projection system during swapping of substrate tables. In this way the liquid supply system can be kept on during swap of substrates and no drying stains can form. Such a dummy substrate is described, for example, in European Patent Application Publication No. EP-1,420,299. An alternative to this system is to bring the second substrate table close to the first substrate table and to move the two substrate tables simultaneously under the projection system. If the gap between the two substrate tables is small (or at least has a drain underneath it) liquid loss should be minimized. In some instances the substrate table WT has its top surface extended by a protrusion which may be rotatable or retractable, as in the form of a drawbridge. Such an arrangement is disclosed in U.S. Pat. No. 7,310,132.

An embodiment of the present invention comprises a remote optical source, a remote detector, an optical waveguide directing light (i.e. electromagnetic radiation) and a coated surface or Bragg reflector. The optical waveguide is configured to direct light from the optical source to the coated surface or Bragg reflector. The optical waveguide may direct light from the coated surface or Bragg reflector to the detector.

The coating or Bragg reflector may be applied to different surfaces of a lithographic apparatus for use in measuring the temperature of the coating or Bragg reflector. If the coating or Bragg reflector is in contact with fluid, fluid temperature can be measured. In this way temperatures at different locations of the apparatus can be measured.

In an embodiment, a physical property of the coating is temperature dependent. In an embodiment, the coating comprises a two phase mixture including a fluorescent component. Thus, in an embodiment, a physical property of the two phase mixture is temperature dependent. The physical property may include: a phase change (e.g., from liquid to solid); a gel transition (e.g. the spatial flexibility of the polymer chains of one component of the mixture); and/or a glass transition (e.g., in molecular chain stiffness).

With a change of temperature, the physical property changes to affect the activity of the fluorescence of the fluorescent component. Such a fluorescent activity may be a change in fluorescent intensity, for example, at a specific frequency, a frequency shift of an intensity peak, or a change in the intensity ratio of two fluorescent frequencies.

Usually the two phase mixture is selected to be sensitive to a typical temperature range. For example, in an immersion system, the temperature range is the range of normal use of an immersion system, e.g., 20 to 25 degrees Celsius.

Thus, the temperature measurement system is dependent upon the optical characteristics of the molecular structure, as indicated by the detected intensity of the specific fluorescent frequencies changes as a function of temperature.

In an embodiment, a Bragg reflector comprises multiple layers of alternating materials with varying refractive index. Each layer boundary causes a partial reflection of an optical wave. For waves whose wavelength is close to four times the optical thickness of the layers the many reflections combine constructively and the layers thereby act as a reflector. In an embodiment, a physical property of the Bragg reflector is temperature dependent. For example, the physical property of the Bragg reflector which varies with temperature is the refractive index or the thickness of a layer. With a change of temperature, the change in physical property varies the wavelength of electromagnetic radiation which is reflected by the Bragg reflector. On the basis of the frequency of electromagnetic radiation which is reflected, a determination of the temperature can be made. The Bragg reflector could be layers of silicon oxide with different refractive indices: i.e. different layers would have different quantities of doping trace elements. In an embodiment, the Bragg reflector is in the form of a coating.

Figure 7:
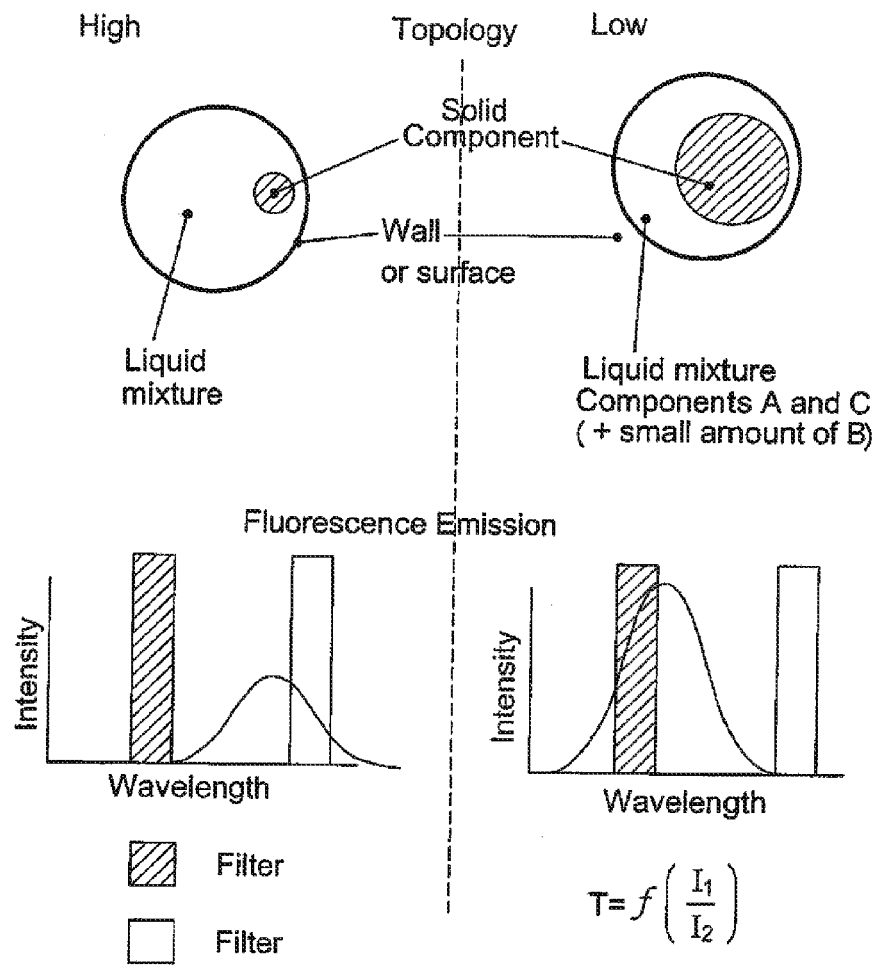
FIG. 7 is a set of illustrations showing the temperature dependent behavior of an example coating formulation according an embodiment of the invention.
Figure 8:
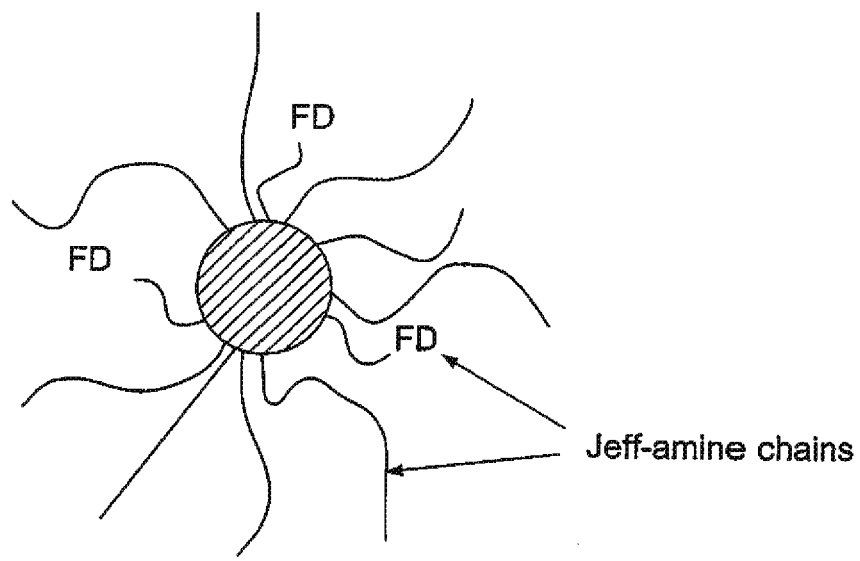
FIG. 8 is a schematic illustration of a further example coating formulation according to an embodiment of the invention.
Figure 9:
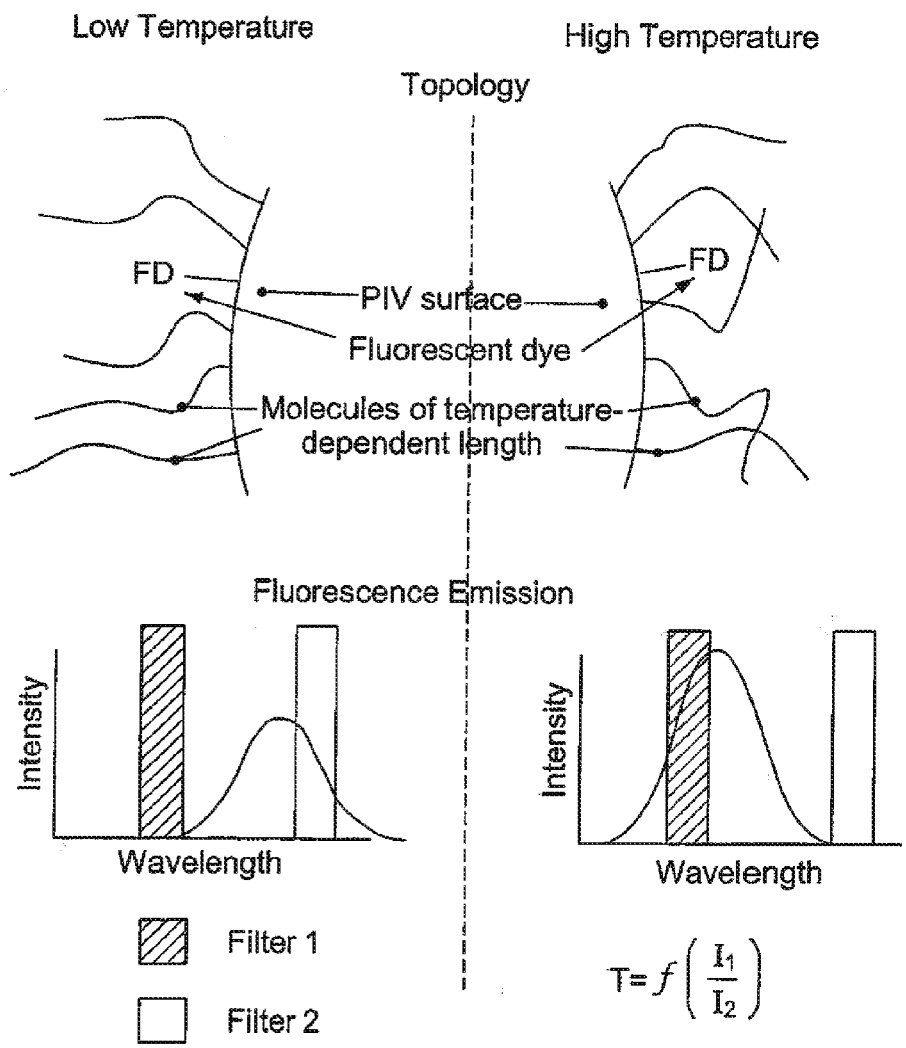
FIG. 9 is a set of illustrations showing the temperature dependent behavior of the example coating formulation shown in FIG. 8.

For the coating embodiment to work specific chemical mixtures may be used. Examples of chemical mixtures are shown in FIGS. 7, 8 and 9 and are referred to here as option 1 and option 2. Although droplets are referred to here, the examples may be applied to a surface in the form of a coating. References to droplets, particles and micro-spheres are for ease of reference. Microspheres may include a walled enclosure, enclosing the chemical mixture, confining to a location of a surface and so coating the surface.

Option 1 is a three component hydrophobic mixture which is emulsified in water. Droplets are formed which are 1-10 μm in size. The droplets are enclosed in an outer wall as shown in FIG. 7. The wall is formed around the hydrophobic droplets after formation of the droplets using a heterogenic polymerization reaction. The heterogenic polymerization results in the formation of closed spheres which are substantially the same size as the original droplets.

Within the walled sphere, there are there components present: A, B and C. In an embodiment there may be more components. Component A, for example, can be a linear saturated carbohydrate ($C_nH_{2n+2}$). Component B is hydrophobic. Component C is a fluorescent dye.

Component A has a low dielectric constant and does not significantly quench a fluorescent signal. It may comprise a molecular chain. The length of the chain of A may be selected so that its melting point (in a pure form) is substantially several degrees lower than the lower limit of the desired temperature measurement range measurement system. In an embodiment, component A is chosen to have a melting point of about 22° C. In an embodiment, component A may be formed of a compound with the generic formula $CH_3[CH_2]_nC_6H_{10}OH$ or $CH_3[CH_2]_nC_6H_5$, for example. In an embodiment, component A may be an alkylcyclo-hexane. In an embodiment, component A makes up about 30-60% of the composition.

Component B has a significantly higher dielectric constant than A. Desirably component B significantly quenches the emission of fluorescent component C. Desirably, the melting point of component B may be 1-5° C. higher than the melting point of component A. Examples of components B are aromatic compounds $C_mH_{2m+1}C_6H_5$, so comprising an aromatic group. In an embodiment, compound B may be a methylalkylene cyclohexane ($CH_3[CH_2]_nC_6H_{11}$). In an embodiment, component B may make up about 30-60% of the composition. In an embodiment, the melting point of component B may be set to be about 1 degree C under that of component A.

In an embodiment, the fluorescent dye, component C, is hydrophobic. It could be fluorescine-methylester or DNS (4-dimethylamino-4'-nitrostilbene). In an embodiment, component C may make up about 5-20% of the composition.

At a temperature above the desired working measurement range for the measurement system, the components form a liquid mixture. As the temperature of the three component mixture decreases, component B partly solidifies. The remainder of component B forms a liquid mixture with components A and C. The melting points of components A and B (in their pure states) are close together. Components A and B are chemically similar.

Because of their close melting points and their chemical similarity, the concentration of component B in the liquid mixture with component A decreases rapidly but continuously with decreasing temperature. The presence of component B in the fluid mixture results in a red shift of the fluorescent signal of component C, which is dissolved in the liquid mixture. Furthermore, the aromatic group of component B quenches the fluorescent emission of component C, reducing the magnitude of the fluorescence signal.

At a low temperature, the concentration of component B in the liquid mixture is low. The fluorescent dye in the droplet emits relatively large amounts of fluorescence with a relatively low wavelength. As temperature increases, the concentration of component B in the liquid mixture increases. With an increase of the concentration of component B in the liquid mixture, there is an increase in wavelength of the fluorescence emitted by the droplet and a decrease in intensity. Since the fluorescent spectrum is strongly temperature-dependent, the temperature can be calculated from the measured fluorescent spectra. This relationship is shown in FIG. 7. Note FIG. 7 mentions two filters. This arrangement is described below.

Option 2 will now be described with reference to FIG. 8. A fluorescent dye and a molecule whose size depends strongly on temperature are attached to the surface of a PIV/PTV particle (or surface), see FIG. 8. The fluorescent dye FD is selected so that its emission spectrum depends strongly on the dielectric constant of its surroundings. An example of such a fluorescent dye is DNS (4-dimethylamino-4'-nitrostilbene). A small amount, typically 0.01-10%, of the surface area of the particle is covered with the dye. The remainder of the surface is covered with hydrophobic molecules of low dielectric constant substance whose length depend strongly on temperature. An example of such a substance is a Jeffamine or PNIPAM (poly (N-isopropylacrylamide)). A Jeffamine or PNIPAM may not be attached to the (glass) tracer particles directly. One solution is to first attach GLYMO (3-Glycidyloxypropyltrimethoxysilane) via a condensation reaction to the (glass) particle surface, after which an epoxy reaction binds the GLYMO to the Jeffamine or PNIPAM.

At low temperature, Jeffamine or PNIPAM chains are long, allowing water to be present in between the chains. At high temperatures, the Jeffamine or PNIPAM chains are contracted, resulting in water-free low dielectric surroundings of the fluorescent dye. This is visualized in FIG. 9. The presence of water decreases the emission intensity and increases the wavelength of fluorescent emission, which can be measured. Note the reference to the two filters as mentioned in FIG. 9 will be described below.

Figure 10:
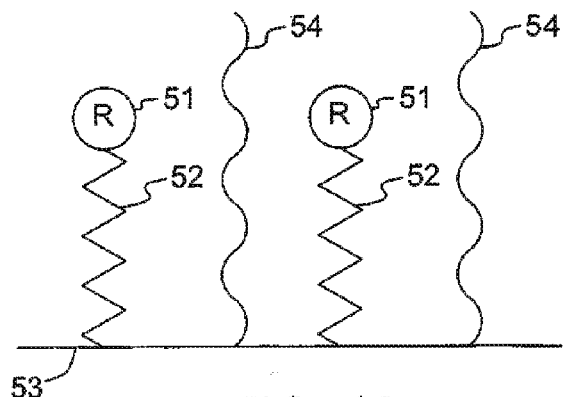
FIG. 10 is a schematic representation of molecules attached to a surface for an exemplary formulation for a coating as shown in FIGS. 8 and 9.

In a simplified explanation of the arrangement of option 2, a fluorescent molecule 51 is attached to a fixed-length spacer 52 which is attached to a surface 53 (see FIG. 10). Attached to the same surface is a polymer chain 54. The effective length and stiffness of the polymer chain 54 is a function of temperature. As a result of the change in chain length and stiffness, the amount of absorbed water in the polymer monolayer changes, which strongly affects the fluorescence spectrum of the fluorescent molecule 51. In an embodiment, the polarity of the light is changed, which may be detected as an intensity measurement in the detected signal of the fluorescent wavelength.

At a specific temperature the polymer chain has a certain length. Under stimulus of photons (with a wavelength selected to interact with the one of the fluorescent chemicals and emitted by a laser, i.e. the optical source of the measurement system) the fluorescent molecules emit photons at a specific wavelength distribution. The intensity of the wavelength over a given wavelength interval relative to a reference signal can indicate the temperature of the surface with an accuracy of about 10 mK, desirably with an accuracy of 1 mK.

These molecular structures, as exemplified herein, may be used on a coating on a surface with any topography, such as a flat, two dimensional surface or small spherical surface. Thus, they may be suitable for all listed embodiments in an immersion system and metrology system herein.

The embodiment of a Bragg reflector is ideally suited for being used on or as the surface of a substrate. Semi-reflective planes parallel to the surface of the substrate can be imprinted onto the top surface of the substrate via an interferometric method. In such a method of applying a Bragg reflector, a glass containing germanium is deposited onto a reflective surface (for example a silicon substrate). The reflective surface is irradiated with light which has a flat wave front of continuous intensity. The light passes through the glass containing germanium and is reflected by the reflective surface. This results in an interference pattern with maxima and minima in the glass containing germanium. The germanium forms micro-crystals opto-chemically at places of positive interference or of negative interference. This changes the refractive index of the glass. The resulting refractive index pattern is a horizontal equidistant grating of high and low refractive index i.e. a Bragg rating. In an alternative embodiment, the Bragg reflector can be made in the same way as a mirror for an extreme ultraviolet (EUV) radiation apparatus. In an embodiment, a polymer with a temperature-dependent length (e.g. a PNIPAM or Jeffamine chain on the surface) can be used. A thin semi-reflective layer, which is desirably inorganic, is then deposited onto the free ends of the polymer using a deposition method, such as atomic layer deposition. The process is then repeated until the desired stack thickness has been achieved. In an embodiment, the Bragg reflector can be built-up using a thin film deposition method in which several layers are deposited in order to achieve the desired structure.

It is possible to monitor the temperature of the surface of the substrate during operation of the lithographic apparatus and thereby determine any temperature fluctuations in the Bragg reflector which may occur during operation of the apparatus.

Light which has an angle of incidence of 90° to the surface and for which the quotient of wavelength and refractive index is exactly identical to two times the layer thickness is reflected. The substrate is illuminated with light with a small but finite wavelength range, of which at every point on the substrate only one frequency is reflected. The frequency of the reflected light is correlated to the substrate surface temperature. Because the frequency of the reflected light can be determined with very high accuracy, this method allows measurement of the substrate surface temperature with high accuracy.

Accuracy of the method can be increased by choosing a material for which refractive index or layer thickness changes strongly over the temperature range of interest. As an example, the temperature range to be measured could fall within the glass transition range of the material.

A Bragg reflector may be manufactured or provided in other areas. For example, a Bragg reflector may be manufactured into part of an outer surface of a substrate table WT, such as near a sensor or an opening for the passage of fluid such as gas and/or immersion liquid. Checking the temperature of the substrate table WT at this location could be part of normal operation of the apparatus, for example during substrate swap. Alternatively or additionally, the Bragg reflector could be positioned around the rim of an optical element (e.g., a lens) to inspect the surface temperature of the side of the optical element, for example the last optical element (similar to the embodiment of FIG. 17a). In this embodiment the optical element of the thermal detection system may be positioned in an inlet or outlet in the substrate table WT or the fluid handling system IH, for example an optical fiber which could be threaded through to a sensor location.

The Bragg reflector could be placed on one or more other components, such as the fluid handling system IH, a shutter member (such as a closing disc, a retractable bridge for moving between stages, or a measurement stage), and/or a measurement stage. In the case of detecting temperature variations on a location of the fluid handling system IH, an optical fiber could be threaded through a pre-existing channel in the fluid handling system IH. In an embodiment, a Bragg reflector may be placed on a metrology or measurement stage. Desirably immersion conditions may be replicated by immersing a substrate on the metrology or measurement stage.

For measurement of variations in temperature of a fluid in a lithographic apparatus, for example in an immersion lithographic apparatus, the above coatings may be applied to particles or may form particles, as described above. These particles are then suspended in fluid which is used in the lithographic apparatus. The particles in the fluid are illuminated as in the other embodiments and four cameras may be used, placed at an angle other than 90° to each other, to record the particles in the place of interest. Two cameras are used for a first wavelength and the other two cameras are used for a second wavelength.

An explanation of embodiments of a thermal measurement system which can be used with the coatings described above will now be given.

Figure 11A:
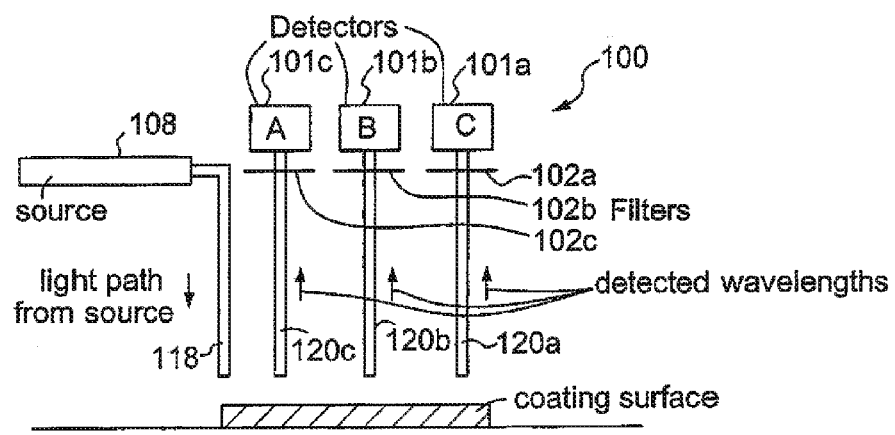
FIGS. 11a and 11b are schematic representations of a thermal measurement system according to an embodiment of the invention.
Figure 11B:
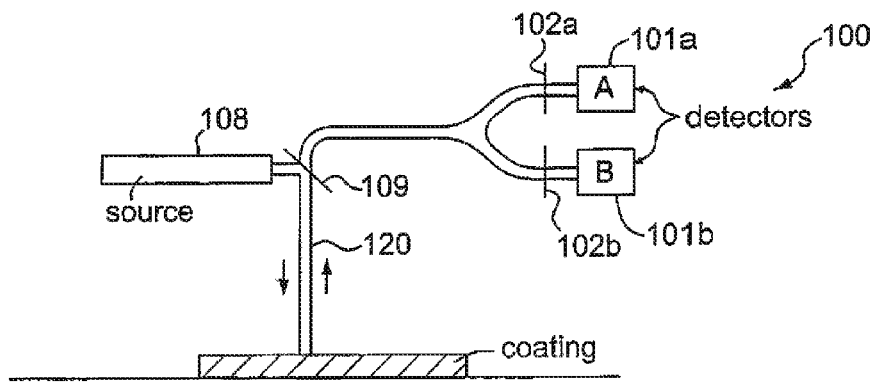

In the optical system of the thermal measurement system 100 there is the optical source 108, the optical waveguides 118, 120, 120a, 120b, 120c and a detector 101a, 101b, 101c, as shown in FIGS. 11a and 11b. FIGS. 11a and 11b show different embodiments of the thermal measurement system. They differ in that FIG. 11a has a separate optical waveguide 120a, 120b, 120c for each light path and FIG. 11b shows a system with a single main light path between the optical system and the coated surface. That is, in the FIG. 11a embodiment the light is projected by the source 108 onto the coating or Bragg reflector through a separate waveguide 118. Reflected light is picked up through waveguides 120a, 120b, 120c and projected back to detectors 101a, 101b, 101c through filters 102a, 102b, 102c respectively. The filters 102, 102b, 102c, filter out all light apart from one preselected frequency.

In the FIG. 11b embodiment, one waveguide 120 is used to transmit light to and from the surface having the coating or Bragg reflector. Light is directed to the detectors 101a, 101b through respective filters 102a, 102b via a bifurcation 109 in the waveguide 120. In the detector 100 of FIG. 11b, two light detectors 101a, 101b (i.e. cameras) are used. Both light detectors 101a, 101b are directed at the measurement surface and equipped with lenses and filters 102a, 102b to isolate the specific wavelengths from other light emitted or reflected by the surface. Each of the detectors is calibrated to detect the intensity of a selected wavelength. Apart from the coating or Bragg reflector materials (e.g., chemical fluorescent compound) used, the dynamic range of the system is dependent on the optical system, for example, the stimulating light source 108 (i.e. the wavelength emitted by a laser of the optical source and its consistency and stability), the filters 102a, 102b and the fibers 120 (i.e. optical waveguides). The materials for these components should be selected so that they are optimized for operating at the applicable wavelengths (for example, a wavelength that would stimulate the materials to fluoresce and that would correspond to the wavelength of the fluorescent radiation) at the desired temperature ranges with the desired accuracy. The optical system may need to be compatible with the immersion fluid at the operation temperature range.

The embodiments shown in FIGS. 11a and 11b are just two examples of possible optical systems. An optical system with an arrangement with similar light paths may be used.

This description applies to a measurement system using option 2. However, similar arrangements may be used using other chemical mixtures. The fluorescent dye on stimulation by a photon from a laser emits a photon at one of two wavelengths A and B. The photon has wavelength B if the chains are extended and water is present in between the chains. The photon has wavelength C if the polymer chains are short and stiff. The ratio of the intensity of wavelength intervals B and C indicates the temperature. The ratio may be made independently of a reference signal from the stimulating light source. The wavelength of the reference signal may be filtered out. Detection of each wavelength may require a designated detector. The intensities and frequencies for wavelengths B and C as detected through the respective filters at high and low temperatures can be seen in FIGS. 7 and 9.

In an embodiment, only one fluorescent wavelength is used. In this case it is necessary to compare the intensity of the detected wavelengths B and A, wavelength A being the reference signal (i.e. from the stimulating laser). The detector for the reference signal at wavelength A would have a filter for wavelength B. The detector for the fluorescent wavelength would have a filter for wavelength A.

Figure 12:
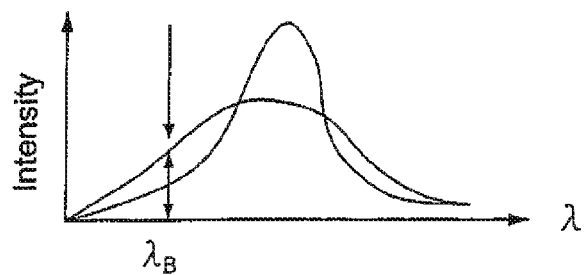
FIG. 12 is an illustration of a detector set to measure at a specific wavelength radiation emitted by a coating at two different temperatures.

Note that the intensity and average frequency of the fluorescence (i.e. the fluorescence spectrum) changes with temperature. Therefore, the detector is set to measure at a specific wavelength $\lambda_B$, to one side of the distribution (Bell) curve of the spectrum. See FIG. 12.

Figure 13:
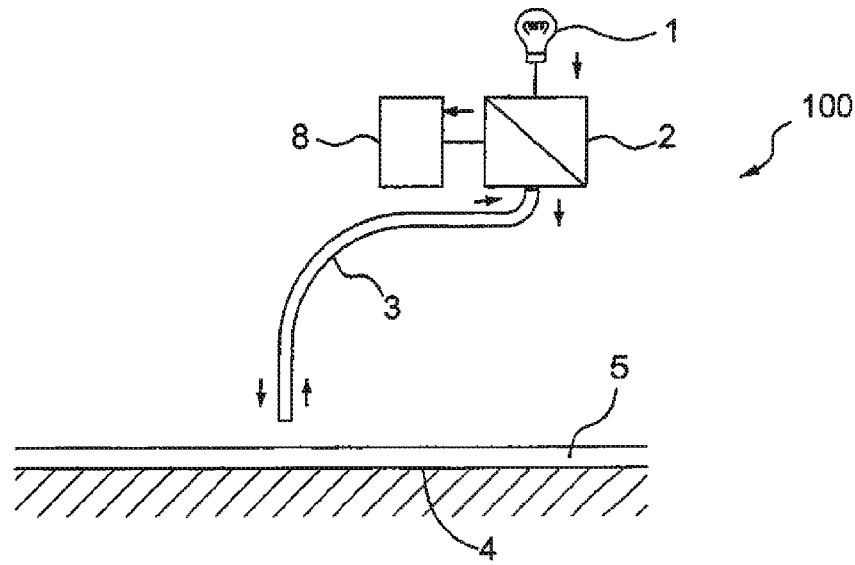
FIG. 13 is an illustration of a detector for use with a Bragg reflector.

FIG. 13 shows an embodiment of detector 100 which can be used in conjunction with the Bragg reflector embodiment. In FIG. 13, the light source 1 is a broadband light source. The light passes through a half mirror 2 and is directed to an optic fiber 3. A single fiber 3 can be used to direct the light to the surface 4 for temperature measurement and its Bragg reflector 5 (e.g., in the form of a coating). The Bragg reflector 5 and the surface 4 have the same temperature. The same fiber 3 is used to transmit the light back to the half mirror 2. The light is reflected to a sensor 8. This arrangement may be fitted to any part of the immersion system as described.

Figure 14:
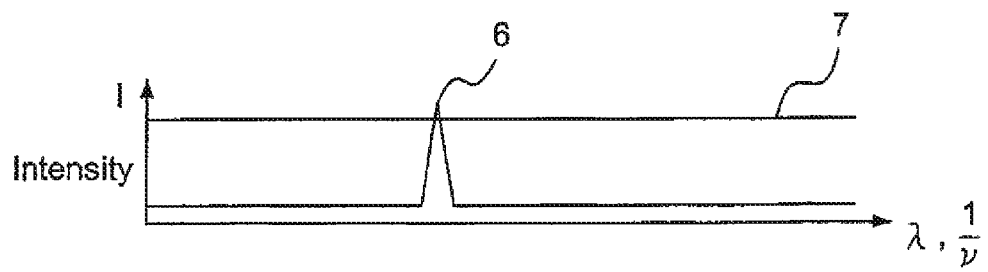
FIG. 14 is a schematic illustration of the signal detected by a sensor in the detector of FIG. 13.

The signal detected 6 at the sensor is shown in FIG. 14 (with reference to the input signal 7). The wavelength is indicative of the surface temperature and has a resolution of the order of 5 mK.

Sample locations of a coating or Bragg reflector may include: the surface of a dummy substrate in the immersion system, a temperature sensor such as a transmission image sensor (TIS), around the outward rim of an optical element (e.g., a lens), other specific locations of the substrate table or the liquid confinement structure, on a metrology system or a measurement stage, a mirror or on a side of the projection system (for contactless temperature measurement).

Figure 15:
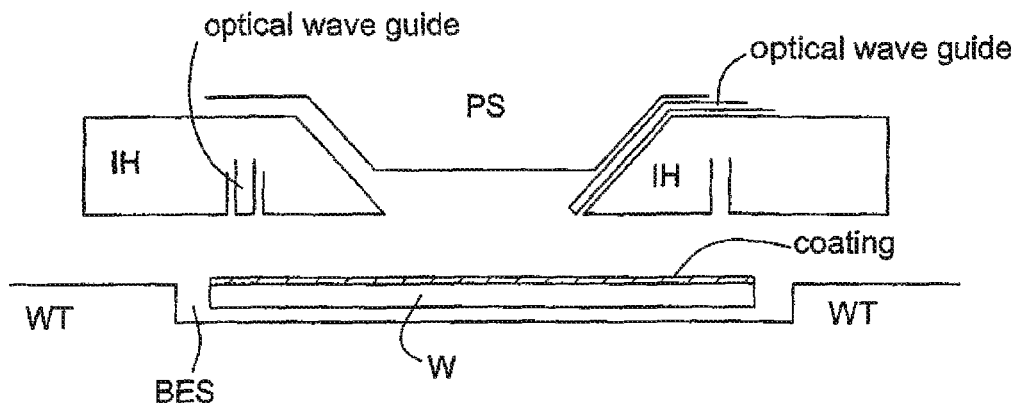
FIG. 15 is a schematic illustration of an immersion system with the thermal measurement system using a dummy substrate, according to an embodiment of the invention.

An optical detector, e.g. a camera, may be used to detect the temperature variations in the immersion liquid flowing over the surface of a dummy substrate DW located in an immersion system, as shown in FIG. 15. In an embodiment the measurement system enables thermal stability and uniformity to be observed during servicing or inspection of an immersion lithography apparatus. The detector may be remote from the immersion system and one or more optical fibers may be located in different locations in the immersion system, for example around the last optical element of the projection system or threaded through an aperture in a liquid confinement or fluid handling structure IH. The surface of a dummy substrate DW may be scanned to detect the immersion liquid temperature on the surface of the dummy substrate DW as the immersion liquid flows through. In this way, performance of the thermal performance of the immersion system may be inspected and observed. The dummy substrate may be a dummy substrate used specifically during servicing or setting up of the apparatus. Alternatively the dummy substrate may be a shutter member which is used to block the opening of a liquid confinement or fluid handling structure IH during swapping of one substrate W for another under the projection system PS. This sort of shutter member can be used so that the liquid confinement or fluid handling structure IH can be kept full of liquid during substrate swap so that the final element of the projection system PS is always maintained wet. The shutter member can be in the form of a closing disc which is removable from a substrate table WT. In an embodiment, the shutter member can be in the form of a surface of the substrate table WT or a bridge which extends between a substrate table and another table, such as a second substrate table, which is moving under the projection system to replace the first substrate table.

Figure 16:
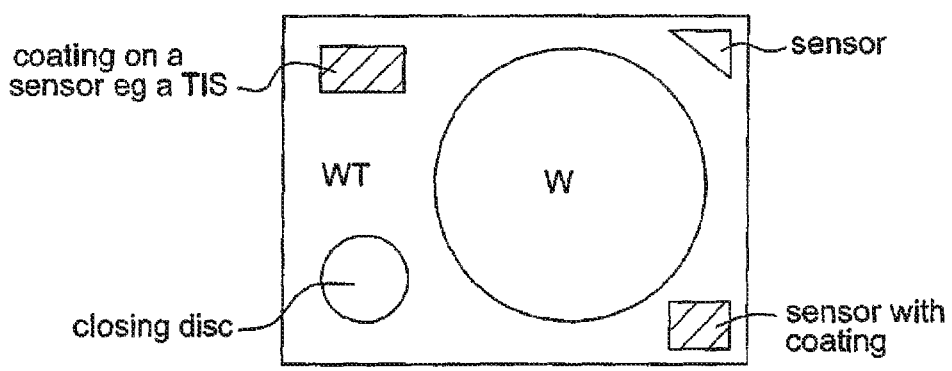
FIG. 16 is a schematic representation of a substrate table having a thermal measurement system according to an embodiment of the invention.

The coating or Bragg reflector may be present on a substrate table or measurement stage, for example at a specific location on the substrate table or measurement table, as shown in FIG. 16. The coating or Bragg reflector could be at any location on a top surface of the substrate or measurement table. The coating or Bragg reflector could be used to measure temperature during a routine temperature check during normal operation of the immersion system, for example during substrate swap. The optical arrangement, like all the other examples, could be similar to the dummy substrate arrangement. The coating or Bragg reflector could be on a sensor. The coating or Bragg reflector is desirably positioned in an area of the sensor which is not illuminated by a beam of radiation (i.e. outside of the measurement area). One such sensor is the transmission image sensor (or TIS). By applying the coating on a TIS, the TIS temperature drift can be measured and corrected for during substrate alignment. TIS drift due to temperature variations, due to the processes applied on the TIS is still an issue in immersion and EUV systems. In immersion systems, immersion liquid evaporation may be a cause of the temperature variations. In an EUV system, the temperature variations which cause TIS drift may be a result of TIS cleaning. Note that as an embodiment of this invention involves the presence of an immersion liquid or other liquid, the coating may be located in a sealed environment in an EUV system, e.g., as a TIS. This is not needed if a Bragg reflector is used.

The coating may be on a specific portion or component of the liquid confinement or fluid handling structure, substrate table or both. These surfaces may be inaccessible and yet have temperatures which are critical to the performance of the lithographic apparatus, particularly its immersion system. Therefore, it may be difficult or impractical to fit known directly connected sensor systems.

In the case of a surface on the liquid confinement or fluid handling structure IH such as a feature on the undersurface of the confinement structure IH (e.g., as shown in FIG. 6, such as a gas or liquid outlet, or a single phase or two fluid inlet), the optical waveguide could be an optical fiber threaded through an aperture in the substrate table WT, with an end defined in the substrate table. The end may direct light from the source to the coated surface. A coated surface on the substrate table WT, such as in the gap BES, at the edge of the substrate holder, between a substrate holder and the surrounding upper surface of the substrate table (i.e. as shown in FIG. 15), may have a light source provided from the end of an optical waveguide position in the surface of a liquid confinement structure IH. The optical waveguide may be threaded through an aperture and a passageway in the liquid confinement or fluid handling structure IH, such as such as a gas knife outlet, a liquid outlet, or a single phase or two phase fluid inlet, as shown in FIG. 6. A large portion of the top surface of the substrate table WT (for example a portion of the so called mirror block or encoder block) may be covered with a coating or a Bragg reflector as described above. In this way a temperature profile of the top surface can be built up in two dimensions. This information could be used, for example, by a controller to heat certain portions (i.e. apply a heat load to certain portions) of the top surface of the substrate table WT in order to maintain its temperature uniformity. One way of doing this might be to provide a light-emitting diode (LED) as a heater. When a portion of the substrate table WT which is below a desired temperature passes under the LED, the LED can be activated thereby to heat up the portion which is under the desired temperature. The radiation directed towards the coating or Bragg reflector and reflected from the coating or Bragg reflector can pass through at least part of the projection system PS of the apparatus so that parts of the substrate table WT under the projection system PS may have their temperature measured. However, a waveguide could be placed in other positions. In this way other positions of the substrate table WT could also have their temperature detected.

Figure 17A:
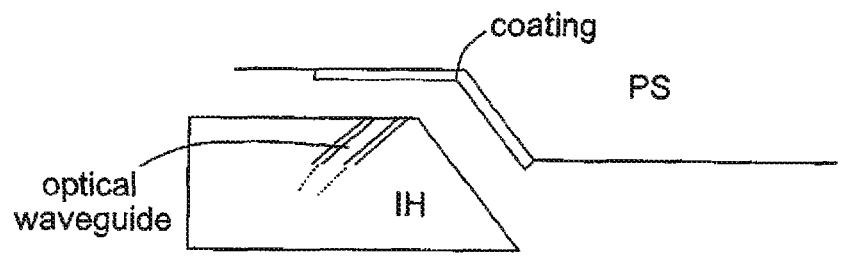
FIGS. 17a and 17b are schematic representations of an immersion system having a thermal measurement system configured to thermally sense a last optical element of a projection system according to an embodiment of the invention.
Figure 17B:
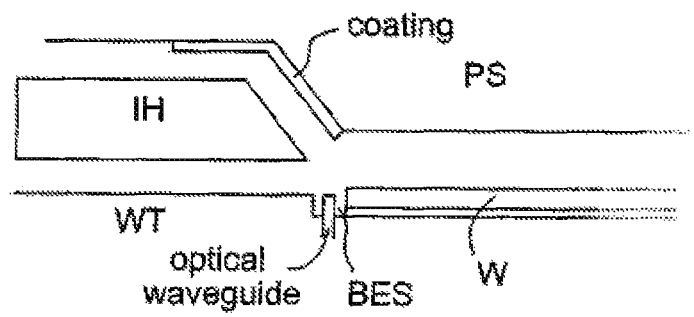

The coating or Bragg reflector may be located around the rim of a last optical element of the projection system PS, as illustrated in FIGS. 17a and b, for example on an optically unused part of the optical element. The optical waveguide may be in the form of an optical fiber. The optical fiber could, for example, as illustrated in FIG. 17a, be threaded through an aperture in the liquid confinement or fluid handling structure IH so as to be able to illuminate and/or receive reflected radiation from the coating or Bragg reflector on the final element of the projection system PS. The optical element (i.e. the coating or Bragg reflector end of the optical waveguide) of the thermal measurement system may be located in the substrate table, for example as an optical fiber threaded through a sensor location or a BES as shown in FIG. 17b (i.e. a gap between the substrate holder (and substrate when present) and the rest of the upper surface of the substrate table). With this arrangement, the thermal performance of the last optical element may be observed. This is particularly suited to immersion lithographic machines.

The coating or Bragg reflector may be applied to a mirror of a projection system of an EUV apparatus. In an embodiment, the coating is on the back side of such a mirror. Temperature variations in the mirror can then be detected. In an embodiment, a feedback loop may be used to heat up a part of the mirror which has cooled down (for example because it has not been illuminated with the beam B for a certain time). In this embodiment a difficulty may occur due to outgassing of the coating (because mirrors of a projection system in an EUV apparatus are held in a vacuum). Therefore, a coating may be difficult to use in this environment but there should be no such problems with a Bragg reflector.

The coating or Bragg reflector may be applied to a surface of a component of an illumination system.

An embodiment of the present invention may be used to detect temperature in-line or off-line. For example, the system could be used to detect temperature variations in tests following manufacture or in tests during diagnosis at a customer plant. Furthermore, the system could be used to detect temperature during substrate swap or even during substrate imaging or substrate measurement.

Upon detection of an undesirable temperature or temperature variation in the surface of the coating or Bragg reflector, the thermal measurement system may initiate a signal. The signal may be received by a controller which is used to control one or more parameters of the provided fluid, e.g. the immersion liquid, or the applicable surface. The parameters may include one or more parameters selected from: flow rate, applied underpressure, a heater present in, for example, the liquid confinement structure or the substrate table, to, for example, apply a heat load in the immersion system, and/or the temperature to which the fluid, i.e. immersion fluid, is conditioned before being supplied to the immersion system. The controller may be operative during exposure of a substrate and/or measurement of a substrate.

The coating or Bragg reflector may be applied to the side of an optical element in, for example, the projection system. The optical source and detector may be positioned in a mounting of the optical element. The thermal measurement system may be used to detect thermal variations which can be used to improve optical element heating correction models.

The coating or Bragg reflector may be applied to a surface of a metrology or measurement stage, in which immersion conditions are replicated by immersing a substrate.

The coating or Bragg reflector could be applied to a glass surface (for example glass beads as in the simultaneous temperature and flow detector), a metal surface and/or a plastic with a metallic coating.

Alternatively or in addition, for point measurements the coating or Bragg reflector may be applied to a tip of a glass fiber. In immersion systems, the tip of the glass fiber may be placed in the immersion liquid. Both illumination and collection of the emitted light can be achieved through the glass fiber.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising a thermal measurement system comprising a thermally sensitive coating or a Bragg reflector, the thermal measurement system configured to detect a temperature of the coating or Bragg reflector to determine a temperature of an immersion liquid in contact with the coating or Bragg reflector as distinct from a temperature of a body with which the coating or Bragg reflector is in direct contact.

2. The lithographic apparatus of claim 1, wherein a property of radiation emitted by the coating or Bragg reflector is dependent on the temperature of the coating or Bragg reflector.

3. The lithographic apparatus of claim 1, wherein the coating or Bragg reflector is provided on at least part of: i) a dummy substrate, ii) a sensor, iii) an optical element of a projection system, iv) a liquid confinement structure, v) a shutter member, vi) a substrate table, vii) a measurement table, viii) a surface of a gap defined at the edge of a substrate holder, ix) a mirror, x) a surface of an illumination system, or xi) any combination selected from i) to x).

4. The lithographic apparatus of claim 1, further comprising a controller configured to change a heat load applied to the coating or Bragg reflector in response to a temperature measurement by the thermal measurement system.

5. The lithographic apparatus of claim 1, further comprising a substrate table configured to support a substrate, a projection system configured to direct a patterned beam of radiation onto a target portion of the substrate, a liquid confinement structure configured to supply and at least partly confine the immersion liquid to a space between the projection system and the substrate, substrate table or both.

6. The lithographic apparatus of claim 5, further comprising a controller configured to change a thermal property of the immersion liquid in response to a temperature measurement by the thermal measurement system.

7. A lithographic apparatus, comprising:
two tables, one of which being a substrate table configured to support a substrate;
a projection system configured to direct a patterned beam of radiation onto a target portion of the substrate;
a liquid handling structure configured to supply and at least partly confine an immersion liquid to a space between the projection system and the substrate, at least one of the two tables, or the at least one of the two tables and the substrate; and
a thermal measurement system comprising a thermally sensitive coating or a Bragg reflector, the thermal measurement system configured to detect a temperature of the immersion liquid in contact with the coating or Bragg reflector as distinct from a temperature of a body with which the coating or Bragg reflector is in direct contact.

8. A metrology apparatus, comprising:
a table;
a liquid handling structure configured to at least partly confine immersion liquid to a space above a portion of the table; and
a thermal measurement system comprising an optically responsive, thermally sensitive coating or a Bragg reflector, the thermal measurement system configured to detect a temperature of the immersion liquid in contact with the coating or Bragg reflector as distinct from a temperature of a body with which the coating or Bragg reflector is in direct contact.

9. A thermal measurement system for a metrology apparatus or a lithographic apparatus, the thermal measurement system comprising:
an optical source configured to supply a beam of radiation;
a coating or Bragg reflector which, in use, is in contact with an immersion liquid, the coating configured to emit radiation in response to the beam of radiation from the optical source; and
a detector configured to detect radiation emitted by the coating or Bragg reflector, wherein a property of the radiation emitted by the coating or Bragg reflector in response to the radiation beam is dependent on a temperature of the coating or Bragg reflector,
wherein the thermal measurement system is configured to determine a temperature of the immersion liquid in contact with the coating or Bragg reflector based on the property of the detected emitted radiation as distinct from a temperature of a body with which the coating or Bragg reflector is in direct contact.

10. The thermal measurement system of claim 9, wherein the property is the intensity of a certain wavelength of radiation.

11. The thermal measurement system of claim 9, wherein the coating comprises a two phase mixture.

12. The thermal measurement system of claim 9, wherein the coating comprises a fluorescent chemical, and the property is the wavelength of radiation emitted by the fluorescent chemical.

13. The thermal measurement system of claim 9, further comprising a waveguide to direct radiation from the optical source to the coating or Bragg reflector, from the coating or Bragg reflector to the detector, or both.

14. A dummy substrate having a width substantially the same as that of a substrate for a lithographic apparatus, for use in a thermal measurement system of an immersion lithographic apparatus, the dummy substrate having a coating or Bragg reflector, wherein the coating or Bragg reflector is configured to emit radiation in response to a radiation beam from an optical source, the emitted radiation having a property which is dependent on a temperature of the coating or Bragg reflector, wherein the thermal measurement system is configured to determine a temperature of an immersion liquid in contact with the coating or Bragg reflector based on the property of the emitted radiation as distinct from a temperature of a surface of the dummy substrate with at least a portion of which the coating or Bragg reflector is in direct contact.

15. The dummy substrate of claim 14, wherein the coating comprises a thermally dependent two phase mixture.

16. The dummy substrate of claim 14, wherein the coating or Bragg reflector is sensitive to a temperature in the range of 290 to 300 Kelvin.

17. The dummy substrate of claim 14, wherein the coating comprises a fluorescent chemical which is configured to emit fluorescent radiation having a wavelength dependent on the temperature of the coating.

18. A method of thermal measurement in a lithographic apparatus, the method comprising detecting radiation emitted by a thermally sensitive coating or a Bragg reflector in contact with an immersion liquid to determine a temperature of the immersion liquid as distinct from a temperature of a body with which the coating or Bragg reflector is in direct contact.

19. A method of thermal measurement in a metrology apparatus wherein immersion liquid is confined to a space above a portion of a table, the thermal measurement comprising detecting radiation emitted by a thermally sensitive coating or a Bragg reflector in contact with the immersion liquid to determine a temperature of the immersion liquid as distinct from a temperature of a body with which the coating or Bragg reflector is in direct contact.

20. A thermal measurement method in a metrology apparatus or a lithographic apparatus, comprising:
  supplying a beam of radiation to a coating or a Bragg reflector;
  detecting radiation emitted by the coating or Bragg reflector; and
  determining a thermal measurement of an immersion liquid in contact with the coating or Bragg reflector from a property of the emitted radiation which is detected, as distinct from a temperature of a body with which the coating or Bragg reflector is in direct contact.

* * * * *